(12) United States Patent
Deurenberg et al.

(10) Patent No.: US 11,674,645 B2
(45) Date of Patent: Jun. 13, 2023

(54) LIGHTING MODULE

(71) Applicant: SIGNIFY HOLDING B.V., Eindhoven (NL)

(72) Inventors: Peter Hubertus Franciscus Deurenberg, S-Hertogenbosch (NL); Herman Johannes Gertrudis Gielen, Valkenswaard (NL); Jimmy Peet, Helmond (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 5 days.

(21) Appl. No.: 17/253,178

(22) PCT Filed: Jun. 17, 2019

(86) PCT No.: PCT/EP2019/065818
§ 371 (c)(1),
(2) Date: Dec. 17, 2020

(87) PCT Pub. No.: WO2019/243225
PCT Pub. Date: Dec. 26, 2019

(65) Prior Publication Data
US 2021/0301989 A1    Sep. 30, 2021

(30) Foreign Application Priority Data

Jun. 21, 2018 (EP) .................................. 18178951

(51) Int. Cl.
*F21S 4/20* (2016.01)
*F21S 4/28* (2016.01)
(Continued)

(52) U.S. Cl.
CPC .............. *F21S 4/28* (2016.01); *F21V 19/003* (2013.01); *F21V 23/003* (2013.01); *F21V 23/06* (2013.01);
(Continued)

(58) Field of Classification Search
CPC ............ F21Y 2107/30; F21Y 2107/40; F21Y 2107/70; F21Y 2115/10; F21S 4/20;
(Continued)

(56) References Cited

U.S. PATENT DOCUMENTS 9,279,544 B1    3/2016 Dankelmann et al.
2006/0264093 A1* 11/2006 Shim .................. G02F 1/13452
439/495

(Continued)

FOREIGN PATENT DOCUMENTS

CN    101521990 B    3/2011
KR    2012018677 A    3/2012

*Primary Examiner* — Omar Rojas Cadima (57) ABSTRACT

The invention provides an improved lighting module, the lighting module comprising an elongated carrier and a flexible circuit. The flexible circuit comprises a first section accommodating a plurality of LED light sources, a second section, and a connector for receiving power to power said plurality of LED light sources; wherein the connector is accommodated in the second section for receiving power to power said plurality of LED light sources and extends at least partly in the first section. The elongated carrier comprises first end-face and a second end-face, and extending there between comprises a first elongated main surface and a second elongated main surface, the second elongated main surface being opposite to said first elongated main surface; wherein the first section of the flexible circuit is connected to said first elongated main surface, and wherein the second section of the flexible circuit is connected to said second elongated main surface.

13 Claims, 4 Drawing Sheets

(51) Int. Cl.
*F21V 19/00* (2006.01)
*F21V 23/00* (2015.01)
*F21V 23/06* (2006.01)
*H05K 1/02* (2006.01)
*H05K 1/18* (2006.01)
*F21Y 103/10* (2016.01)
*F21Y 115/10* (2016.01)

(52) U.S. Cl.
CPC ............. *H05K 1/028* (2013.01); *H05K 1/189* (2013.01); *F21Y 2103/10* (2016.08); *F21Y 2115/10* (2016.08); *H05K 2201/10106* (2013.01)

(58) Field of Classification Search
CPC  F21S 4/24; F21S 43/14; F21S 41/141; H05K 1/0281; H05K 3/0061; H05K 2201/056; H05K 1/028; H05K 2201/055; H05K 1/0393; H05K 2201/10106; F21K 9/00
See application file for complete search history.

(56) References Cited

U.S. PATENT DOCUMENTS

| | | | |
|---|---|---|---|
| 2009/0135583 A1* | 5/2009 | Hillman | G02F 1/133608 362/97.1 |
| 2010/0220046 A1 | 9/2010 | Plotz et al. | |
| 2012/0020096 A1 | 1/2012 | Chiang et al. | |
| 2012/0106197 A1* | 5/2012 | Lai | B32B 37/12 362/609 |
| 2014/0340913 A1* | 11/2014 | Cui | F21K 9/238 362/382 |
| 2015/0117001 A1 | 4/2015 | Fan | |
| 2015/0211698 A1 | 7/2015 | Yeh et al. | |
| 2016/0025311 A1 | 1/2016 | Tischler | |
| 2016/0085117 A1* | 3/2016 | Arai | G02F 1/133608 348/725 |
| 2018/0356686 A1* | 12/2018 | Yeh | H05K 1/142 |

* cited by examiner

LIGHTING MODULE

CROSS-REFERENCE TO PRIOR APPLICATIONS

This application is the U.S. National Phase application under 35 U.S.C. § 371 of International Application No. PCT/EP2019/065818, filed on Jun. 17, 2019, which claims the benefit of European Patent Application No. 18178951.2, filed on Jun. 21, 2018. These applications are hereby incorporated by reference herein.

FIELD OF THE INVENTION

The invention relates to a lighting module comprising an elongated carrier and a flexible circuit. The invention further relates to a lighting device comprising such a lighting module and a connecting unit. The invention further relates to a method of manufacturing a lighting module comprising a flexible circuit and an elongated carrier. The invention further relates to a method of electrically connecting a lighting module according to the invention with a connecting unit.

BACKGROUND OF THE INVENTION

Considering a circular economy and a demand for serviceability, the lighting industry moves increasingly towards lighting modules which are easily replaceable and/or exchangeable in the field. These lighting modules may often comprise a Printed Circuit Board (PCB) with a plurality of semiconductor light sources (e.g. a CEM1 board with LED light sources). Such a lighting module may for example be fitted into e.g. a luminaire or a troffer. Such a lighting module may however be impractical or disadvantageous for line-lighting applications—wherein the concept of line-lighting is commonly accepted in the field as a linear lighting application providing a continuous and/or uninterrupted line of light—because such a lighting module often comprises a connector for powering said module which interrupts said line of light and/or margins said line of light (at the edge of the module).

For example, considering an elongated lighting module comprising a Printed Circuit Board with a connector disposed at one end: Placing this lighting module into e.g. a troffer will render a dark vignette at the edge of the lighting module, hence margining the line of light and giving an inconvenient and inefficient line-lighting experience; Placing a plurality of such lighting modules back to back into e.g. troffer will render a plurality of undesired interruptions in the line of light, hence also giving an inconvenient and inefficient line-lighting experience. This is especially disadvantageous in LED line-lighting applications, for example if the area required for the connector is bigger than the pitch between the LED light sources.

SUMMARY OF THE INVENTION

It is an object of the invention to provide an improved lighting module, which at least alleviates the problems mentioned above; e.g. providing an improved and/or cost-reduced lighting module for line lighting applications without having undesired interruptions in the line of light. Thereto, the invention provides a lighting module comprising an elongated carrier and a flexible circuit; wherein the flexible circuit comprises a first section accommodating a plurality of LED light sources, a second section, and a connector; wherein the connector is accommodated in the second section for receiving power to power said plurality of LED light sources and extends at least partly in the first section; wherein the elongated carrier comprises first end-face and a second end-face, and extending therebetween comprises a first elongated main surface and a second elongated main surface, the second elongated main surface being opposite to said first elongated main surface; wherein the first section of the flexible circuit is connected to said first elongated main surface, and wherein the second section of the flexible circuit is connected to said second elongated main surface.

Such a lighting module comprises an elongated carrier comprising a first end-face, a second end-face and extending therebetween a first elongated main surface and a second elongated main surface. The second elongated main surface and the first elongated main surface are opposite to each other. Such a lighting module also comprises a flexible circuit. More specifically, the flexible circuit may also be defined as a flexible Printed Circuit Board; a circuit foil or film; or a flexible electronic(s). The flexible circuit comprises a first section accommodating a plurality of LED light sources, which first section is connected to said first elongated main surface. The flexible circuit also comprises a second section accommodating a connector for receiving power to power said plurality of LED light sources, which second section is connected to said second elongated main surface. More specifically, the connector may also be defined as an electrode; a terminal; or a track or an electronic track. Moreover, said LED light source may be any other semiconductor light source, such as e.g. OLED. Said light sources may radiate outwards away from the flexible circuit and/or essentially away from the elongated carrier, and may alternative comprise optics therefor.

Moreover, said elongated carrier may also be defined as an elongated substrate, or elongated strip. The elongated carrier may be defined as elongated (essentially/substantially) extending in an axial (length) direction. Hereby, the elongated carrier may be extending in an axial direction, but be comprising a curvature in axial direction. Some luminaire design examples comprise such a slightly bended form. Furthermore: The phrasing of 'extending therebetween' may essentially mean 'extending between the first end-face and the second end-face'. Furthermore: as mentioned, the flexible circuit may be connected to said first elongated main surface, but alternatively said flexible circuit may be mounted, provided, or seated to said first elongated main surface.

Therefore, by this very configuration, a plurality of LED light sources will be present at the first elongated main surface of the elongated carrier for providing line-lighting continuously between the first end-face and second end-face, whereas said connector (arranged for powering said LED light sources) will be present at the second elongated main surface of the elongated carrier and thereby not interrupting the line-lighting provided by said LED light sources. Hence, the present invention may provide an advantageous and improved lighting module for line-lighting applications.

The improved configuration of the lighting module according to the invention is furthermore advantageous in terms of cost-reduction. The lighting module is namely enabled by the described implementation of the flexible circuit. The flexible circuit may hereby, in embodiments, be connected to a more rigid carrier (Flex-on-Rigid) to ensure that the lighting module obtains a form, a fit and/or a function similar to regular PCB technology, such as e.g. CEM1 or FR4 based PCB's. The advantage of using such a Flex-on-Rigid configuration is that costs are significantly reduced: i.e. a flexible PCB (flexible circuit) is generally about 10 USD cents per 4 feet, whereas a CEM1 PCB is generally about 80 USD cents per 4 feet. Thus, the lighting module according to the invention may have a clear cost advantage over lighting modules making use of said regular PCB technology to solve said above problems (e.g. by alternative placement of components to provide a continuous line of light).

More cost reduction may further be achieved. As partly mentioned before: The first section of the flexible circuit is connected to said first elongated main surface, and the second section of the flexible circuit is connected to said second elongated main surface. The connector is accommodated in the second section for receiving power to power said plurality of LED light sources. The connector also extends at least partly in the first section. As a result of this, the manufacturing of the lighting module is facilitated, and manufacturing costs are less. Namely: A particular configuration of the flexible circuit may be used for a plurality of length sizes of the elongated carrier, because the connector may extend at least partly into the first section. Hence, no dedicated flexible circuit may be required for a plurality of elongated carriers, but a single or a standardized flexible circuit may be used for each of said plurality of elongated carriers. Moreover, less precision is required in cutting a flexible circuit strip so as to obtain the flexible circuit, which is connected to the first elongated main surface and second elongated main surface respectively. Furthermore, the connecting of the first section of said flexible circuit to said first elongated main surface and the connecting of the second section of the flexible circuit to said second elongated main surface, so as to position the connector accordingly at least at the second section, is less meticulous due to the possibility for the connector to extend at least partly in the first section.

For example, the connector may comprise a track disposed on the flexible circuit, which track may be extending into the first section and running along the LED light sources. This may significantly reduce costs of manufacturing the lighting module according to the invention.

In an embodiment, the connector may extend completely in the first section. Thus, in such cases, the connector may cover the completely a length of the firsts section. In another embodiment, the connector may extend at least partly in the first section, wherein the connector extends to a halve, a quarter, or one-eighth of a length of the first section.

Consequently, as partly mentioned, an improved lighting module is established. For example: Since the connector of the lighting module is located at a surface opposite to the surface having the plurality of LED light sources, the module may easily be fitted and/or mounted to e.g. a luminaire or a troffer via the surface having the connector, while still keeping an uninterrupted continuous line of light via the surface having the LED light sources. As the flexible circuit facilitating such a configuration is moreover cost-effective, the proposed lighting module may be advantageous in the field of lighting, which field of lighting moves towards easily replaceable and exchangeable line-lighting applications in the field.

In an embodiment, the elongated carrier comprises at least one rim arranged on the first elongated main surface, wherein the at least one rim extends continuously between the first end-face and the second end-face. By introducing said at least one rim to the elongated carrier, which provides more mass away from a center of the cross-sectional profile of the elongated carrier, more bending stiffness may be obtained. Said at least one rim may e.g. be two rims, each extending on either elongated edge of the first surface. The at least one rim may in embodiments comprise a connection means for optics. The at least one rim may be, or may serve as, a lightguide, a reflector or a mixing wall. For example, said at least one rim may be transparent, translucent, reflective, or opaque.

In an embodiment, the flexible circuit may be folded around the second end-face or the first end-face. Thus, the flexible circuit comprises a fold being folded around the second end-face or the first end-face. (Thus, the lighting module comprises either a first or second an end-face around which the flexible circuit may be folded). Such a lighting module is advantageous, as the flexible circuit may be connected to said first elongated main surface, easily folded over the first end-face or the second end-face, and subsequently be connected to said second elongated main surface. Such a fold is enabled by the flexibility of the flexible circuit, which means that the flexible circuit may for example be manufactured in one piece, but able to be connected or draped upon opposite surfaces.

A flexible circuit accommodating a plurality of LED light sources with a particular pitch in between said LED light sources may e.g. be supplied as a starting material for manufacturing said lighting module. A connector, or a track being the connector, may run along the plurality of LED light sources. The flexible circuit may subsequently be cut to a particular size to form the lighting module according to the invention. Said cut may be in between two consecutive LED light sources, i.e. in between the pitch. Subsequently, when connecting said flexible circuit to the elongated carrier: The first section of the flexible circuit is connected to said first elongated main surface, and the second section of the flexible circuit is connected to said second elongated main surface; wherein the flexible circuit may be folded around the second end-face or the first end-face. Thus, the flexible circuit comprises a fold being folded around the second end-face or the first end-face. The second section is therefore formed after the bend of the flexible circuit, which part before the bend remains or may be the first section accommodating the plurality of LED light sources. Thus, the flexible circuit comprises a first section, wherein the first section may be bend at any location form after the bend a second section accommodating the connector.

In further embodiments, the flexible circuit may be folded around the second end-face or the first end-face by means of a fold, wherein the fold is located at an interface between the first section of the flexible circuit and the second section of the flexible circuit. Such a fold at the interface between said first section and said second section may be preferred, since it constitutes a clear boundary between the connector and its connecting function and the plurality of LED light sources and its line-lighting function. Alternatively, the flexible circuit may be folded around the second end-face or the first end-face by means of a fold, wherein the fold is located within (or at) the first section of the flexible circuit. In this situation, it is ensured that the second section accommodating the connector is fully located on the second elongated main surface.

Yet alternatively, in some embodiments, it may be preferred that the lighting module comprises more than one connector, for example a connector on either edge of the elongated lighting module, such that the lighting module may be connected on either edge to facilitate a more versatile application, mounting, etc. Thus, a second connector; or a 'further' connector. Hence, in such a situation, the connector according to the invention may be phrased as the first connector. Thereto, in some embodiments, the flexible circuit may comprise a third section accommodating a second (or: further) connector for receiving power to power said plurality of LED light sources; wherein said first section of the flexible circuit is located between said second section and said third section of the flexible circuit; wherein the third section of the flexible circuit may be connected to said second elongated main surface. Thus, in even a further embodiment related thereto, the flexible circuit may be folded around the second end-face and the first end-face. Both connectors may be arranged to receive power to power said plurality of LED light sources, whereas only one of those or both may be powering the LED light sources when in operation. Hereby, a lighting module is established which is capable of being connected to receive power via either the first connector, the second connector, or both. Mounting and operability is hence facilitated. Moreover, whenever a first connector fails within e.g. a troffer, the lighting module may easily be detached from the troffer, rotated, and mounted again in the troffer with the second connector performing the function of the failed first connector.

In further embodiments, the flexible circuit may be folded around the second end-face and the first end-face by means of a first fold and a second (or: further) fold, wherein the first fold is located at an interface between the first section of the flexible circuit and respectively the second section of the flexible circuit, wherein the second (or: further) fold is located at an interface between the first section of the flexible circuit and respectively the third section of the flexible circuit. Such a first fold and second (or: further) fold at the interface between said first section and respectively said second section and said third section may be preferred, since it constitutes a clear boundary between the connector and its connecting function and the plurality of LED light sources and its line-lighting function. Alternatively, said first fold and said second (or: further) fold may be located within (or at) the first section of the flexible circuit. This again ensures that the sections accommodating the connector are fully on the second elongated main surface.

In an embodiment, the first end-face and/or the second end-face comprises a recess for folding around the flexible circuit. Thus, the flexible circuit is folded around the recess. Thus, as mentioned, the first end-face and/or the second end-face may comprise a recess around which the flexible circuit is folded. Such an embodiment is advantageous, because the recess may protect a fold created by folding around the flexible circuit around said respective first end-face or second end-face. This is especially advantageous whenever the lighting modules are positioned back to back in e.g. a luminaire or troffer. Namely: The present invention advantageously enables to create a continuous line of light with the lighting modules, which may for example be established by tightly fitting a lighting module in e.g. a troffer or a luminaire, or by tightly fitting a plurality of lighting modules back to back to each other in e.g. a troffer or a luminaire. However, this may expose any of said fold(s) around the respective end-faces to friction when mounting. As said friction may result in possible wear of the flexible circuit, the recess of the present embodiment is advantageously preventing such a situation.

Said recess may be an incurvature or may be stepped. In embodiments, a depth of said recess may be at least equal to a thickness of the flexible circuit; or may be at most equal to twice the thickness of the flexible circuit. Such an embodiment is advantageous, as a clear balance is found between the depth required to protect the fold of the flexible circuit and the requirement to create a recess in the elongated carrier.

In an embodiment, the elongated carrier may be made of a material being one of: a metal, a ceramic, a polymer, or a combination thereof. The elongated carrier may for example be made of copper, aluminum, or steel; or Polypropylene (PP), Polyethylene terephthalate (PET), polyethylene (PE); or fiber reinforced polymer, such as e.g. carbon fiber or glass fiber.

In an embodiment, the elongated carrier may comprise a length, the length being defined as the shortest distance between the first end-face and the second end-face, the length being at least 50 centimeters. Yet alternatively, said length may be at least 100 centimeters, or at least 150 centimeters, such as e.g. 200 centimeters. Such a length may be a standard length for specific types of troffers or luminaires. Such a length may also be defined by industry standards or market preferences.

For example, said length may at least be 2 ft, or 560 millimeters. Said length may also at least e.g. be 4 ft or 1150 millimeters; 5 ft or 1450 millimeters; 1 ft or 280 millimeters; 0.5 ft or 140 millimeters. Said length may for example be such that only one lighting module is required over the length of one lighting device and/or luminaire.

In an embodiment, the first section of the flexible circuit may comprise at least thirty successively arranged LED light sources. For example, said first section of the flexible circuit may comprise at least 50 successively arranged LED light sources, or at least 100 successively arranged LED light sources, or at least 200 successively arranged LED light sources, or at least 300 successively arranged LED light sources. Such LED light sources may be arranged on the flexible circuit in a matrix, wherein the matrix may for example comprise a single (linear) column/line; two columns/lines; or three columns/lines. Said LED light sources may be RGB colored or white; and may provide a full spectrum of color. More LED light sources means more pixels and higher resolution of the line-lighting application. The amount of LED light sources being successively arranged may also be defined by industry standards or market preferences. A maximum pitch between successively arranged LED light sources may be at most 18 millimeters.

It may be advantageous for line-lighting applications to have a lighting module which comprises a limited width. Such a width may be defined by the amount of LED light sources implemented and the configuration of the array of LED light sources disposed on the flexible circuit. Hence, in an embodiment, the elongated carrier comprises a width, the width being defined as the shortest distance of the first elongated main surface perpendicular to said length of the elongated carrier, the width being at most four centimeters. In some embodiments, the width being at most three centimeters. In some embodiments, the width being at most five centimeters, e.g. for bigger modules, e.g. in false ceiling applications. Alternatively, the width may be at most two centimeters, or at most one centimeter. Said width may also be defined by industry standards or market preferences. Furthermore, a minimum width may be at least three millimeters, or at least the width of a LED light source. Such a minimum width may alternatively be at least 14 millimeters, as modules may e.g. be 15-16 millimeters in width.

In an embodiment, the elongated carrier may be plate-shaped. Such a shape may be manufactured more easily and may comprise a standard shape. Further, in examples, said elongated carrier may be a I-shaped elongated profile, a H-shaped elongated profile, a L-shaped elongated profile, a U-shaped elongated profile, etc. The elongated carrier may for example be extruded. Alternatively, said lighting module, including said flexible circuit, may for example be partly manufactured by extrusion.

As mentioned before, the proposed lighting module may be advantageous in the field of lighting, especially in line-lighting applications, which field of lighting moves towards easily replaceable and exchangeable line-lighting applications in the field. Replacement of lighting modules comprising an elongated shape may be cumbersome whenever the lighting module deflects under its own weight. Therefore, it may be advantageous that a lighting module comprises sufficient bending stiffness.

Hence, in an embodiment, the elongated carrier may comprise a cross-section comprising a curvature for improving the bending stiffness of the lighting module and for thereby reducing a deflection of the lighting module in its elongated direction. Said bending stiffness may be defined as the height which one end of the elongated carrier may deflect when having the other end fully constrained in its degrees of freedom. In some examples, therefore, the elongated carrier may comprise a bending stiffness, wherein the bending stiffness is defined as the deflection of the second end-face when the first end-face is fully constrained in all its degrees of freedom, wherein said deflection of the second end-face in respect to the first end-face is not greater than 10 centimeters (under its own weight, without any other external forces). In some examples, said deflection may not be greater than 5 centimeters (under its own weight, without any other external forces).

Said curvature may be a circular curvature with a radius of curvature. Said curvature may for example span an angle between 40 degrees and 120 degrees, or span at most 90 degrees; or span an angle between 60 degrees and 180 degrees.

As mentioned, said bending stiffness may be obtained by introducing rims to the elongated carrier, which provide more mass away from a center of the cross-sectional profile of the elongated carrier. Thus, in an embodiment, the elongated carrier comprises at least one rim arranged on the first elongated main surface, wherein the at least one rim extends continuously between the first end-face and the second end-face. The rims may additionally serve as a connection means for e.g. optics or for mounting the lighting module, or serve as a lightguide, reflector or mixing wall. Said at least one rim may e.g. be two rims, each extending on either elongated edge of the first surface. Said at least one rim may e.g. be four rims. For example, said four rims may be formed by two pairs of rims, wherein one couple of rims extends on a first elongated edge of the first surface and the second couple of rims extends on a second elongated edge of the first surface. Thereby, a respective groove may be formed in-between each of said pair of rims, which groove may advantageously comprise/or be used for: connecting means for e.g. optics, or mounting means for mounting the light module, or (serve as) a lightguide, a reflector, or a mixing wall.

Alternatively, in other aspects, said cost of the lighting module may be reduced even further by having the elongated carrier be part of the flexible circuit. In such embodiments, the flexible circuit may comprise the elongated carrier, wherein a cross-section of the elongated carrier may comprise a curvature for improving the stiffness of the lighting module and for thereby reducing a deflection of the lighting module in its elongated direction. The elongated carrier may therefore be a flexible layer for reinforcing the flexible circuit, such as a reinforcing metal layer, adhesive layer, or polymer layer. The elongated carrier may also be flexible strip, such as a polymer strip or a metal strip. Said cross-section may be the cross-sectional profile of the elongated carrier, hence the profile of the elongated carrier in connection—e.g. in assembly—with the flexible circuit. Said cross-section may thus be the plane perpendicular to the longitudinal axis of the elongated carrier, i.e. the plane perpendicular to the line extending between the first end-face and the second end-face.

As mentioned before, mutatis mutandis, said bending stiffness may be defined as the height one end of the elongated carrier may deflect when having the other end fully constrained in its degrees of freedom. In some examples, therefore, the elongated carrier may comprise a bending stiffness, wherein the bending stiffness is defined as the deflection of the second end-face when the first end-face is fully constrained in all its degrees of freedom, wherein said deflection of the second end-face in respect to the first end-face is not greater than 10 centimeters (under its own weight). In some examples, said deflection may not be greater than 5 centimeters (under its own weight). Said curvature may be a circular curvature with a radius of curvature. Said circular curvature may for example span an angle between 40 degrees and 120 degrees, or span at most 90 degrees; or span an angle between 60 degrees and 180 degrees. Alternatively, at higher radius of curvature, e.g. above 20 centimeters, said curvature may for example span at most 40 degrees, or preferably span at most 30 degrees; or preferably span at most 20 degrees.

In an embodiment, the flexible circuit is folded around the first end-face and the elongated carrier is plate-shaped; wherein the elongated carrier comprises a length, the length being defined as the shortest distance between the first end-face and the second end-face, the length being at least 100 centimeters; wherein the first section of the flexible circuit comprises at least fifty successively arranged LED light sources; wherein the elongated carrier comprises a width, the width being defined as the shortest distance of the first elongated main surface perpendicular to said length of the elongated carrier, the width being at most four centimeters. Such a configuration of the lighting module may become an industry standard, hence advantageously reducing manufacturing costs.

In all embodiments, the connector (either the first, or the second, or both, or any more connectors) and the plurality of LED light sources may be arranged consecutively on the flexible circuit. Said components may form a single line on the flexible circuit along the elongated direction of the lighting module. Hence, the flexible circuit may be a strip, which may e.g. be a straight strip without branches. Moreover, the connector(s) may not only be arranged for receiving power to power said plurality of LED light sources, but may also or solely be arranged—in respect to the plurality of LED light sources or other components on the flexible circuit—for data communication, for data exchange, for providing control commands, for outputting diagnostics signals, or for mechanical fixture.

Moreover, the flexible circuit may comprise itself a plurality of layers, wherein the circuit may be disposed therein. One of such layers may be the elongated carrier, usually the bottom layer.

The flexible circuit may have a thickness of at most 2 millimeters, or at most 1 millimeter, preferably at most 0.5 millimeter, or preferably at most 0.2 millimeter. Alternatively, said thickness may be at most 1 millimeters. The LED light sources accommodated on the flexible substrate may protrude therefrom.

As mentioned, an improved lighting module is established, which may for example be more easily mounted in a lighting device such as e.g. a luminaire or a troffer. As a result, since the connector of the lighting module is located at the second elongated main surface opposite to the first elongated main surface having the plurality of LED light sources, the module may easily be fitted and/or mounted via said second elongated main surface having the connector, while still keeping an uninterrupted continuous line of light via the first elongated main surface having the plurality of LED light sources.

Thus, it is a further object of the invention to provide an improved lighting device, which at least alleviates the problems and disadvantages mentioned above. Thereto, the invention further provides a lighting device comprising at least one lighting module according to the invention and at least one connecting unit comprising a connecting area; wherein each connecting unit is configured to electrically connect a respective connector of the at least one lighting module with the connecting area.

Said connecting unit may be designed to receive the lighting module and/or the connector according to the invention. Hence, said connecting unit may be arranged, via said connecting area, to receive and connect to an electrode, an electronic track, the circuit, or a terminal on the flexible circuit. The connecting unit may, via the connecting area, itself have a matching connector, track, pins, terminals, etc. accordingly. The connecting area may e.g. be a connecting unit connector, an electrode, an electronic track; or for example whenever the connecting area serves as a female connector, the connector according to the invention may serve as a male connector, or vice versa. These means may be known in the art of electrical connection means to a person skilled in the art.

Thus, the lighting device may either accommodate one lighting module or a plurality of lighting modules. When having a plurality of lighting modules, the lighting modules may be arranged back to back. Each module may then e.g. have its own respective connecting unit.

Alternatively, lighting modules may share one connecting unit, for example when the connection area may be arranged for receiving e.g. two lighting modules (and their respective connectors). Hence, in an embodiment, the at least one connecting unit is configured to electrically connect the connector of a respective first lighting module and the connector of a respective second (or: further) lighting module with the connecting area. This may be advantageous in mounting the lighting modules in the lighting device, as less connecting units are required.

In an embodiment, the connecting unit comprises a slot for receiving and/or detachably fixating the at least one lighting module. Consequently, the lighting modules may be easily attached and/or detached to/from the lighting device, which facilitates the replaceability or serviceability of the lighting device.

In an embodiment, the lighting device further comprises a lighting driver for providing power, wherein each connecting unit is arranged to receive power from said lighting driver and relay said power to the at least one lighting module.

Furthermore, in an embodiment, the first end-face of a first respective lighting module abuts with the second end-face of a second respective lighting module. It may namely be advantageous to position the lighting modules back to back in the lighting device, as the present invention secures a continuous line of light.

Said invention may also be implemented in troffer-based lighting devices. Hence, in an embodiment, the lighting device further comprises a troffer accommodating the at least one lighting module and the at least one connecting unit.

The advantages and/or embodiments applying to the lighting module according to the invention may also apply mutatis mutandis to the present lighting device according to the invention.

It is a further object of the invention to provide an improved method of manufacturing a lighting module, which at least alleviates the problems and disadvantages mentioned above. Thereto, the invention further provides a method of manufacturing a lighting module comprising a flexible circuit and an elongated carrier, wherein the elongated carrier comprises first end-face and a second end-face, and extending therebetween comprises a first elongated main surface and a second elongated main surface, the second elongated main surface being opposite to said first elongated main surface, wherein the method comprising: connecting a first section of a flexible circuit to the first elongated main surface of the elongated carrier, wherein the first section accommodates a plurality of LED light sources; folding the flexible circuit around the second end-face of the elongated carrier; connecting a second section of the flexible circuit to the second elongated main surface of the elongated carrier, wherein the second section accommodates a connector for receiving power to power said plurality of LED light sources.

The advantages and/or embodiments applying to the lighting module and/or the lighting device according to the invention may also apply mutatis mutandis to the present method according to the invention.

It is a further object of the invention to provide an improved method of electrically connecting a lighting module, which at least alleviates the problems and disadvantages mentioned above. Thereto, the invention further provides, a method of electrically connecting a lighting module according to the invention with a connecting unit comprising a connecting area and a slot, the method comprising: receiving and/or detachably fixating the connector of the lighting module in said slot; electrically connecting the connector of the lighting module with the connecting area of the connecting unit.

The advantages and/or embodiments applying to the lighting module and/or the lighting device according to the invention may also apply mutatis mutandis to the present method according to the invention.

In aspects of the invention, there may be provided a lighting module comprising an elongated carrier and a flexible circuit; wherein the flexible circuit comprises a first section accommodating a plurality of LED light sources and a second section accommodating a connector for receiving power to power said plurality of LED light sources; wherein the elongated carrier comprises first end-face and a second end-face, and extending therebetween comprises a first elongated main surface and a third elongated main surface, the third elongated main surface being perpendicular to said first elongated main surface; wherein the first section of the flexible circuit is connected to said first elongated main surface, and wherein the second section of the flexible circuit is connected to said third elongated main surface.

The second section accommodating the connector may in this aspect therefore be a branch of the flexible circuit, which is connected to the third elongated main surface (a side surface, hence having the connector on the 'side' instead of on the 'back'). This may be advantageous for lighting devices, into which the lighting module is fitted, which only have a connecting unit matching to the third elongated main surface of the lighting module or differently phrased 'side'.

The advantages and/or embodiments applying to the lighting module according to the invention may also apply mutatis mutandis to the present lighting module according to the further aspects of the invention.

In aspects of the invention, there is provided: A lighting module comprising an elongated carrier and a flexible circuit; wherein the flexible circuit comprises a first section accommodating a plurality of LED light sources and, a second section accommodating a connector for receiving power to power said plurality of LED light sources; wherein the elongated carrier comprises first end-face and a second end-face, and extending therebetween comprises a first elongated main surface and a second elongated main surface, the second elongated main surface being opposite to said first elongated main surface; wherein the first section of the flexible circuit is connected to said first elongated main surface, and wherein the second section of the flexible circuit is connected to said second elongated main surface.

BRIEF DESCRIPTION OF THE DRAWINGS

The invention will now be further elucidated by means of the schematic non-limiting drawings.

DETAILED DESCRIPTION OF THE EMBODIMENTS

As mentioned, the present invention provides an improved and/or cost reduced lighting module for line-lighting applications. Such a module does not have undesired interruptions in the line of light, because the connector of the lighting module is located at a surface opposite to the surface having the plurality of LED light sources. Therefore, the module may easily be fitted and/or mounted to e.g. a luminaire or a troffer via the surface having the connector, while still keeping an uninterrupted continuous line of light via the surface having the LED light sources.

Figure 1A:
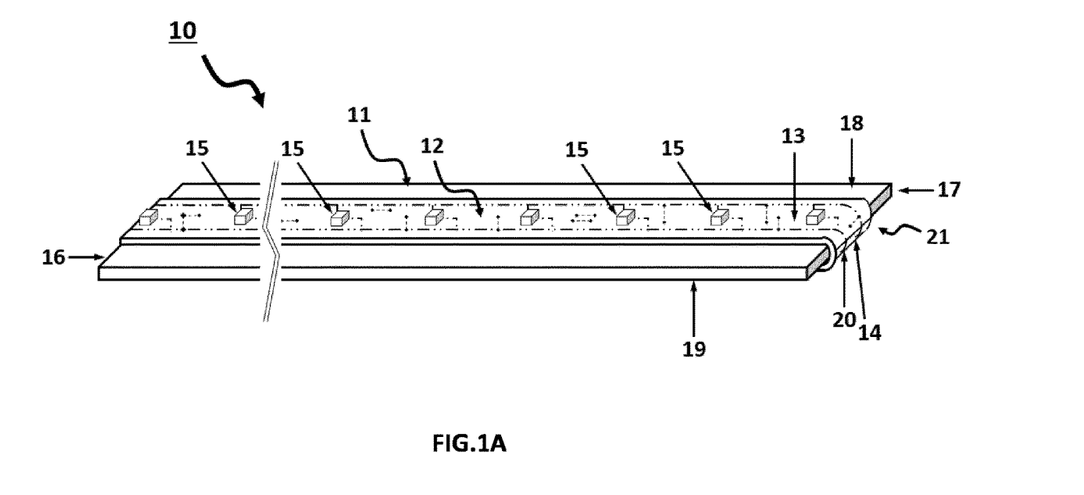
FIG. 1A depicts schematically, by non-limiting example, a first embodiment of a lighting module according to the invention, whereby
Figure 1B:
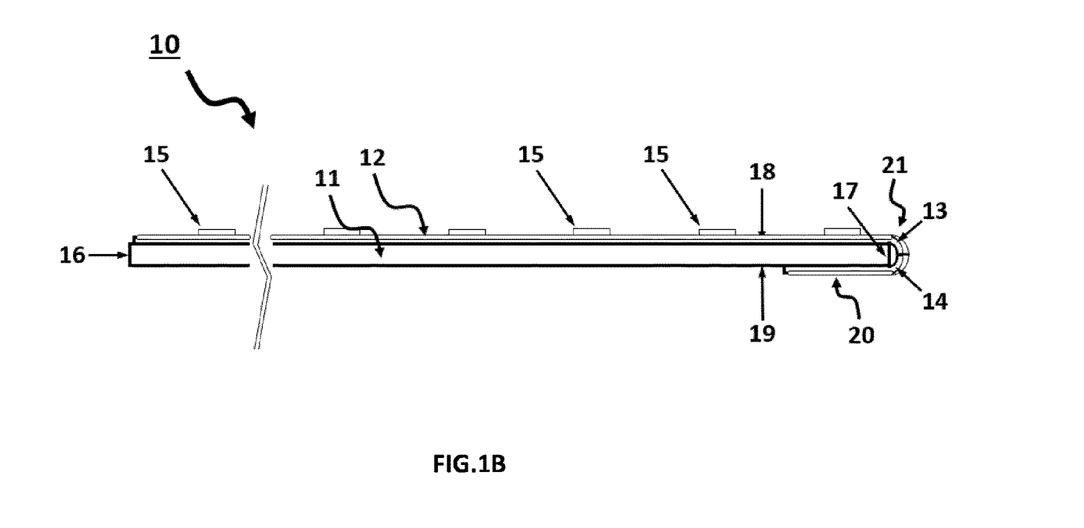
FIG. 1B depicts schematically a cross-sectional-view thereof.

FIG. 1A depicts schematically, by non-limiting example, an embodiment of a lighting module 10 comprising an elongated carrier 11 and a flexible circuit 12. FIG. 1B depicts schematically a side-view of said embodiment depicted in FIG. 1A.

The lighting module 10 comprises an elongated carrier 11 comprising a first end-face 16 and a second end-face 17. Extending between the first end-face 16 and the second end-face 17 are a first elongated main surface 18 and a second elongated main surface 19. Here, the elongated carrier 11 is plate-shaped, but may alternatively comprise another cross-section, such as e.g. I-shaped, H-shaped, L-shaped, U-shaped, etc. Furthermore, the second elongated main surface 19 and the first elongated main surface 18 are opposite to each other.

Here, the elongated carrier 11 is made of aluminum. Alternatively, the elongated carrier may be made of any other metal, a ceramic, a polymer, or a combination thereof. The dimensions of the elongated carrier 11 are chosen such that it may serve as a standard module in industry. The length of the elongated carrier 11, which length is being defined as the shortest distance between the first end-face 16 and the second end-face 17, is 56 centimeters (for convenience, not the complete length is depicted in the figures). Thus, the length corresponds to a 2 ft LED module. Alternatively, said length may be at least 100 centimeters, at least 50 centimeters, at least 150 centimeters, or for example 200 centimeters. Here, the height of the elongated carrier 11 is 1.5 millimeter. In examples, said height may be between 0.5 millimeter and 3 millimeters. The width of the elongated carrier 11, which is defined as the shortest distance of the first elongated main surface 18 perpendicular to the length of the elongated carrier 11, is 1.5 centimeters. Alternatively, the width of the elongated carrier may for example be at most 3 centimeters, or at most 4 centimeters.

Due to these dimensions and choice of material, the elongated carrier 11 is sufficiently rigid/stiff. As mentioned before, the proposed lighting module 10 may be advantageous in the field of lighting, especially in line-lighting applications, which field of lighting moves towards easily replaceable and exchangeable line-lighting applications in the field. Replacement of lighting modules comprising an elongated shape may be cumbersome whenever the lighting module deflects under its own weight. Therefore, it may be advantageous that a lighting module comprises sufficient bending stiffness, as demonstrated here. The bending stiffness of the elongated carrier 11, which is defined as the height the second end-face 17 deflects when the first end-face 16 is fully constrained in all its degrees of freedom. Here, said deflection is not greater than 5 centimeters. Said deflection may be reduced by alternatively introducing a curvature in the cross-sectional profile of the plate-shaped elongated carrier, for example a curvature of 20 degrees.

Yet alternatively, not-depicted, said bending stiffness may be obtained by introducing rims to the elongated carrier. Thus, the elongated carrier may comprise at least one rim arranged on the first elongated main surface, wherein the at least one rim extends continuously between the first end-face and the second end-face. The rims may additionally serve as a connection means for e.g. optics or for mounting the lighting module, or serve as a lightguide, reflector or mixing wall.

Referring to FIG. 1A and FIG. 1B, the flexible circuit 12 is one single-piece elongated flexible strip which comprises electronic tracks, and has a first section 13 and a second section 14. The flexible circuit comprises a thickness of 0.2 millimeter. The first section 13 of the flexible circuit 12 accommodates a plurality of LED light sources 15, which alternatively may any other semiconductor lighting device. Alternatively, other electronic components or circuit features may be present. The light sources radiate outwards away from flexible circuit. As the elongated carrier 11 is 56 centimeters, the flexible circuit 12 may accommodate for example 56 successively arranged LED light sources 15 with a pitch therebetween of approximately 1 centimeter, which are arranged in a single line along the tracks of the circuitry of the flexible substrate 12. Alternatively, two or three lines of LED's may be placed next to each other, e.g. such as respectively a 2×56 or 3×56 matrix along the length of the lighting module.

Still referring to FIG. 1A and FIG. 1B, the flexible circuit 12 comprises a first section 13 accommodating a plurality of LED light sources 15 and a second section 14 accommodating a connector 20 for receiving power to power said plurality of LED light sources 15. The connector 20 is an electrode embedded in the circuitry of the flexible circuit 12; or a plurality of electrodes, such as two or three electrodes, common to powering electronics. The connector 20 extends at least partly in the first section 13. To be more specific, the flexible circuit comprises electrodes throughout over the complete length of the elongated carrier 11 so as to be able to connect to a power at any location source whenever connected to a connecting unit. Hence, the connector 20 extends fully, i.e. 100% in the first section 13. Alternatively, said extending may e.g. be 80%, 40%, 20%, 10%, 50% in the first section. Alternative connector configurations may also be possible, such as e.g. electronic tracks or pins, etc.

The first section 13 of the flexible circuit 12 is connected to said first elongated main surface 18. The second section 14 is connected to said second elongated main surface 19. Said connection may e.g. be by adhesive or other alternative conventional types of bonding. Therefore, by this very configuration, a plurality of LED light sources 15 will be present at the first elongated main surface 18 of the elongated carrier 11 for providing line-lighting continuously between the first end-face 16 and second end-face 17, whereas said connector (arranged for powering said LED light sources 15, or alternatively to provide control means or control data) will be present at the second elongated main surface 19 of the elongated carrier 11 and thereby not interrupting the line-lighting provided by said LED light sources 15 along the first elongated main surface 18 of the elongated carrier 11. Hence, the present invention may provide an advantageous and improved lighting module 10 for line-lighting applications.

Furthermore, still referring to FIG. 1A and FIG. 1B, the flexible circuit 12 is folded around the second end-face 17. Said folding renders (or: results in) a fold 21. This fold 21 is located at the interface between the first section 13 of the flexible circuit 12 and the second section 14 of the flexible circuit 12, which interface is a clear boundary between the connector 20 and its connecting function (at the second surface) and the plurality of LED light sources 15 and its line-lighting function. Alternatively, the flexible circuit may be folded around the second end-face, wherein the fold is located at the first section of the flexible circuit. In this situation, it is ensured that the second section accommodating the connector is fully located on the second elongated main surface.

Figure 2:
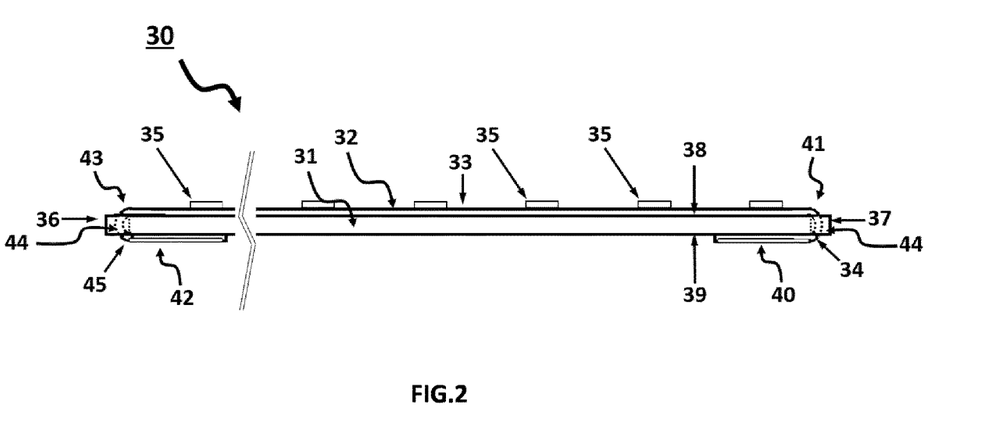
FIG. 2 depicts schematically, by non-limiting example, a cross-sectional-view of a second embodiment of a lighting module according to the invention.

FIG. 2 depicts schematically a cross-sectional-view of a second embodiment of a lighting module 30, which is partly similar to the embodiment depicted in FIG. 1A-1B. Here, the lighting module 30 comprises again an elongated carrier 31 and a flexible circuit 32. The elongated carrier 31 comprises a first end-face 36 and a second end-face 37, and extending therebetween a first elongated main surface 38 and a second elongated main surface 39. The second elongated main surface 39 and the first elongated main surface 38 are opposite to each other. The materials and dimensions of the elongated carrier 31 of the lighting module 30 are similar to the embodiment depicted in FIG. 1A-1B.

Here, the flexible circuit 32 comprises a first section 33 accommodating a plurality of LED light sources 35, a second section 34 accommodating a connector 40 for receiving power to power the plurality of LED light sources, a third section 45 accommodating a further connector 42 for receiving power to power the plurality of LED light sources. The first section 33 of the flexible circuit 32 is connected to said first elongated main surface 38, and the second section 34 of the flexible circuit 32 and the third section 45 of the flexible circuit 32 are both connected to said second elongated main surface 39. Here, the first section 33 of the flexible circuit 32 is located between said second section 34 and said third section 45. The flexible circuit 32 is therefore a strip which is partitioned into three parts, having their own electrical purpose/task/functioning. Here, said connector 40 and said further connector 42 are electrodes embedded in the circuitry of the flexible circuit.

Referring to FIG. 2, thereto, the flexible circuit 32 is folded around the second end-face 37 by means of a fold 41 and folded around the first end-face 36 by means of a further fold 43. The first fold is located at the first section 33 of the flexible circuit 32, such that no undesired bending or folding is needed at the second section 34 nor the third section 45, which accommodate respectively the connector 40 and the further connector 42. The connector and the further connector extend at least partly in the first section (not explicitly depicted here). Alternatively, said folds may be present at the interface between the first section and respectively the third section and second section.

Still referring to FIG. 2, additionally, the first end-face 36 and the second end-face 37 of the elongated carrier 31 both comprise a recess 44 for folding around the flexible circuit 32. Thus, the fold 41 and the further fold 43 are comprised within said recess 44, which protects said folds 41, 43 from wear and possible damage; for example, when the lighting module is mounted in e.g. a luminaire abutting an edge or another lighting module. Here, the recess 44 is a stepped recess, but may alternatively be an incurvature. The depth of the recess is equal to 0.7 millimeter, which is at least twice the thickness of the flexible circuit, which was 0.2 millimeter. Moreover, in aspects, said recess may also comprise a depth taking into account possible application of adhesive tape required to attach said flexible circuit. Alternative dimensions may be envisioned. The recess may alternatively serve as a connection means for detachably fixating the lighting module in e.g. a luminaire, or a matching connecting unit; for example, the outer edges of the end-faces (not the recessed part) may fit into a holder.

Thus, both the connector 40 as well as the further connector 42 are arranged to receive power to power said plurality of LED light sources, whereas only one of those or both may be powering the LED light sources when in operation. Hereby, a lighting module is established which is capable of being connected to receive power via either the first connector, the second connector, or both. Mounting and operability is hence facilitated. Moreover, whenever a first connector fails within e.g. a troffer, the lighting module may easily be detached from the troffer, rotated, and mounted again in the troffer with the second connector performing the function of the failed first connector.

Figure 3:
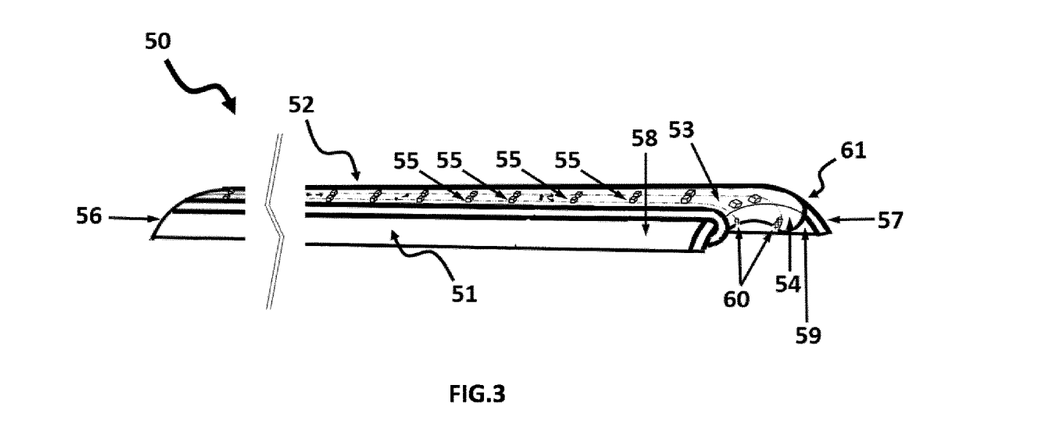
FIG. 3 depicts schematically, by non-limiting example, a perspective-view of a third embodiment of a lighting module according to the invention.

FIG. 3 depicts schematically, by non-limiting example, a perspective-view of a third, alternative, embodiment of a lighting module 50 according to the invention, which is partly similar to the embodiments depicted in FIGS. 1A-1B and FIG. 2. The lighting module 50 comprises the flexible carrier 52. Here, however, the flexible circuit 52 comprises the elongated carrier 51; which are in assembly. Said assembly is a plate-shaped elongated strip. Such an assembly may be established when manufacturing or producing said flexible circuit 52. The elongated carrier 51 is therefore a reinforcing layer of the flexible circuit 52, which is a copper layer, but alternatively may be any other layer such as polymer or metal, or fiber reinforced polymer. The elongated carrier 51 and the flexible circuit are bond by means of an adhesive, but may alternatively be bond by pressing or another bonding technique. Here, the flexible circuit 52 has a thickness of 0.2 millimeter and the elongated carrier 51 comprised therein comprises a thickness of 0.6 millimeter. Alternatively, other layers may be present in the flexible circuit, such as a laminate of reinforcing layers, di-electric layers, thermal layers, insulation layers, etc. The elongated carrier 51 comprises a first end-face 56 and a second end-face 57, and extending therebetween comprises a first elongated main surface 58 and a second elongated main surface 59. The lighting module is 100 centimeters in length, i.e. the shortest distance between the first end-face and the second end-face. The second elongated main surface 59 is opposite to said first elongated main surface 58.

Similarly, as before, the flexible circuit 51 also comprises a first section 53 accommodating a plurality of LED light sources 55 and a second section 54 accommodating a connector 60 for receiving power to power the plurality of LED light sources 55. The LED light sources 55 are arranged on the lighting module 50 in two lines next to each other. Said first section 53 and said second section 54 are part of the circuitry layer of the flexible circuit 51, whereas the elongated carrier 51 is part of the reinforcing layer (hence not containing any electronic/circuitry function) of the flexible circuit 52. The first section 53 of the flexible circuit 52 is connected to a first elongated main surface 58 of the elongated carrier 51. The second section 54 of the flexible circuit 52 is connected to said second elongated main surface 59. The first section 53 accommodates a plurality of LED light sources, but may alternatively host other components in the circuitry required to control or drive for example the LED light sources. The second section 54 accommodates a connector 60, which is an electric track with electrodes embedded within the circuitry of the flexible circuit 52. The connector (i.e. the electric track) extends at least partly in the first section.

The cross-section of the elongated carrier 51 comprises a curvature for improving the stiffness of the lighting module 50. The curvature comprises an angle of 110 degrees, but may alternatively be an angle between 50 degrees and 150 degrees. Thereby, the deflection of the lighting module 50 in elongated direction is reduced. Namely, the deflection of the second end-face in respect to the first end-face (which is constrained in all its degrees of freedom) is not greater than 5 centimeters.

Furthermore, still referring to FIG. 3, the layer containing the first section 53 and the second section 54 of the flexible circuit 52 is folded around the second end-face 57. Said folding renders (or: results in) a fold 61. This fold 61 is located at the interface between the first section 53 of the flexible circuit 52 and the second section 54 of the flexible circuit 52, which interface is a clear boundary between the connector 60 and its connecting function and the plurality of LED light sources 55 and its line-lighting function. Hereby, the connection function means that the connector is present and is arranged for receiving power to power said plurality of LED light sources. Hence, a clear hierarchy of layers is established for the lighting module 50, wherein the flexible circuit 52 comprises at least a layer with the first section 53, the elongated carrier 51 reinforcing said layer thereunder, and at the second end close to the second end-face 57 there is the back-folded layer with the second section 54.

Figure 4:
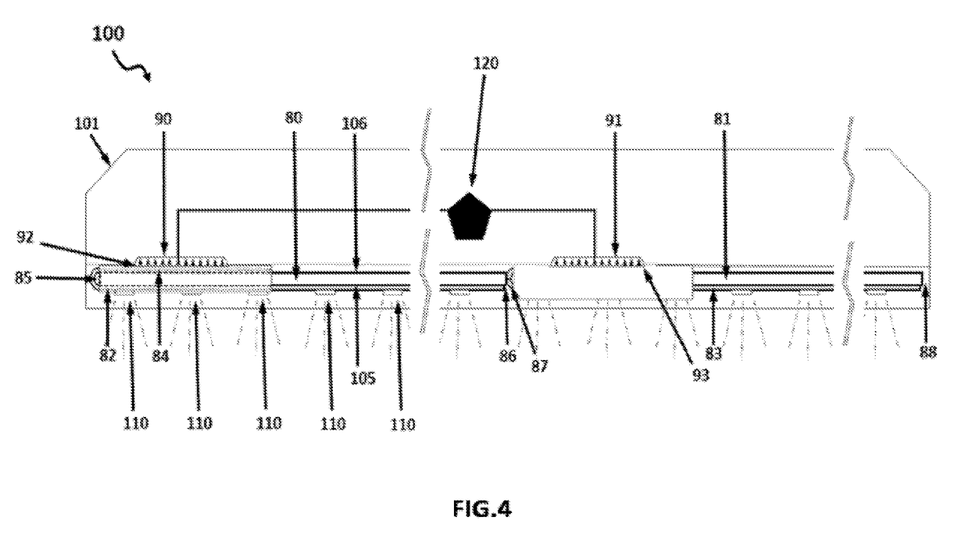
FIG. 4 depicts schematically, by non-limiting example, an embodiment of a lighting device comprising a lighting module according to the invention and a connecting unit.

FIG. 4 depicts schematically, by non-limiting example, an embodiment of a lighting device 100 according to the invention. The lighting device 100 comprises a housing 101, such as e.g. a troffer or a luminaire casing. The housing 101 comprises and/or accommodates a lighting module 80 according to the invention and a connecting unit 90. The lighting module 80 is detachably fixated to said connecting unit 90 by means of a slot (not depicted) comprised by the connecting unit 90. Said slot (not depicted) may be accessible by means of pressing the lighting module 80 through teeth, which may result in a common click connection. Hence, the lighting module 80 is detachably fixated and/or connected to said connecting unit 90 by means of a click connection. Alternatively, other connecting means may be envisioned such as sliding, gluing, press-fitting, Velcro, etc.

Furthermore, the housing 101 comprises and/or accommodates a further lighting module 81 and a corresponding further connecting unit 90. As the lighting modules may be standardized, the lighting modules and connecting units may be interchangeable and compatible with each other. Hence, the lighting device 100 and its housing 101 comprise, in this example, two lighting modules 80, 81 mounted therein. Alternatively, any other applicable number of lighting modules may be mounted into the lighting device. Here, the further lighting module 81 is also similarly detachably fixated to its respective connecting unit 91 by means of a slot (not depicted) comprised by the further connecting unit 91. Consequently, the lighting modules 80, 81 may be easily attached and/or detached to/from the lighting device 100, which facilitates the replaceability or serviceability of the lighting device 100.

Referring to FIG. 4, as mentioned, the lighting device 100 comprises within its housing 101 the lighting module 80 and the further lighting module 81, which are respectively received by and detachably fixated to the connecting unit 90 and the further connecting unit 91. The connecting unit 90 comprises a connecting area 92; and similarly, the further connecting unit comprises a further connecting area 93. Said connecting areas 92, 93 are electrodes, which may e.g. be spring-loaded by a spring means so as to press against any connecting connector. Said electrodes may alternatively be connectors, tracks, pins, terminals, etc. The connector 84 of the lighting module 80, which is an electrode (or alternatively: electric track) within the circuit of the flexible circuit 82 of the lighting unit 80, is thereby electrically connecting to the connecting area 92 of the connecting unit 90. The same applies for the connector (not depicted due to blocking perspective of the further connecting unit 91, not a see-through applied) of the flexible circuit 83 of the lighting unit 81, which connector is electrically connecting to the further connecting area 93 of the further connecting unit 91.

Still referring to FIG. 4, the second end-face 85 of the lighting module 80 abuts with a wall of the housing 101. The first end-face 88 of the further lighting module abuts with a wall of the housing 101. Moreover, the first end-face 86 of the lighting module 80 abuts with the second end-face 87 of the further lighting module 81. Alternatively, the lighting module may for example comprise a recess, as mentioned before, such that said abutting does not damage or wear the bend of the bended flexible circuit.

Thus, the present invention provides an improved lighting module, which may be more easily mounted in a lighting device such as e.g. a luminaire or a troffer. Since the connector 90 of the lighting module 80 is located at the respective second elongated main surface 105 opposite to the first elongated main surface 106 having the plurality of LED light sources 110, the lighting module 80 may easily be fitted and/or mounted via said second elongated main surface 105 having respectively the connector 90, while still keeping an uninterrupted continuous line of light via the first elongated main surface 106 having the plurality of LED light sources 110. The same applies to the further lighting module 91 mutatis mutandis.

Thus, the lighting device 100 accommodates a plurality of lighting modules 80, 81, which are arranged back to back. Here, each module 80, 81 has its own respective connecting unit 90, 91. Alternatively, at least one connecting unit may be configured to electrically connect the connector of a respective first lighting module and the connector of a respective second lighting module with its connecting area.

Still referring to FIG. 4, the lighting device 100 further comprises a lighting driver 120 for providing power. Each connecting unit 90, 91 is arranged to receive power from said lighting driver 120 and relay said power to the respective lighting module 80, 81. Alternatively, said driver may be a controller for providing control commands to each respective lighting module via said connecting unit, its connecting area and the respective connector.

Moreover, each lighting module according to the present invention may be comprised within a lighting device comprising a connecting unit.

Figure 5:
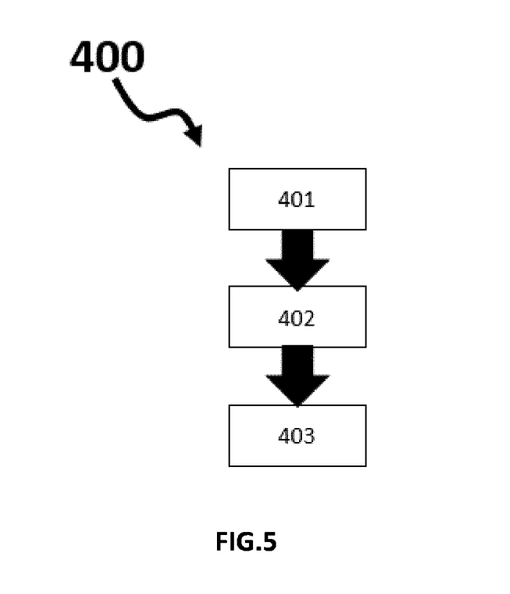
FIG. 5 depicts schematically, by non-limiting example, within a flowchart, an embodiment of a method of manufacturing a lighting module comprising a flexible circuit and an elongated carrier.

FIG. 5 depicts schematically, by non-limiting example, within a flowchart, a method 400 of manufacturing a lighting module comprising a flexible circuit and an elongated carrier. The elongated carrier comprises first end-face and a second end-face, and extending therebetween comprises a first elongated main surface and a second elongated main surface, the second elongated main surface being opposite to said first elongated main surface. The method 400 comprises the step of 401 connecting a first section of a flexible circuit to the first elongated main surface of the elongated carrier, wherein the first section accommodates a plurality of LED light sources. Subsequently, a second step is: 402 folding the flexible circuit around the second end-face of the elongated carrier. A further step is: 403 connecting a second section of the flexible circuit to the second elongated main surface of the elongated carrier, wherein the second section accommodates a connector for receiving power to power said plurality of LED light sources.

Figure 6:
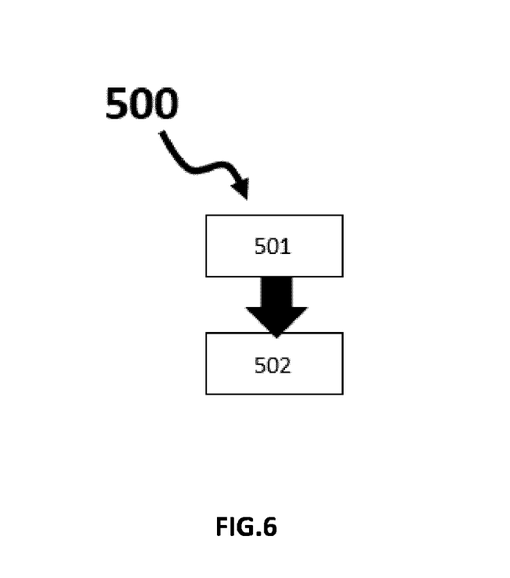
FIG. 6 depicts schematically, by non-limiting example, within a flowchart, an embodiment of a method of electrically connecting a lighting module according to the invention with a connecting unit comprising a connecting area and a slot.

FIG. 6 depicts schematically, by non-limiting example, within a flowchart, a method 500 of electrically connecting a lighting module according to the invention with a connecting unit comprising a connecting area and a slot. The method 500 comprises the step 501: receiving and/or detachably fixating the connector of the lighting module in said slot; and the step 502 electrically connecting the connector of the lighting module with the connecting area of the connecting unit.

The invention claimed is:

1. A lighting module comprising an elongated carrier and a flexible circuit;
wherein the flexible circuit comprises a first section accommodating a plurality of LED light sources, a second section and a connector;
wherein the connector is embedded in a circuitry of the flexible circuit and is accommodated in the second section for receiving power to power said plurality of LED light sources and for providing control commands to the plurality of LED light sources, wherein the connector extends at least partly in the first section;
wherein the elongated carrier comprises first end-face and a second end-face, and extending therebetween comprises a first elongated main surface and a second elongated main surface, the second elongated main surface being opposite to said first elongated main surface;
wherein the flexible circuit is folded around the second end-face, and wherein the second end-face comprises a recess, such that the fold is entirely comprised within the recess;
wherein the first section of the flexible circuit is connected to said first elongated main surface, and wherein the second section of the flexible circuit is connected to said second elongated main surface; and
wherein the elongated carrier comprises a cross-section comprising a curvature for improving the bending stiffness of the lighting module and for thereby reducing a deflection of the lighting module in its elongated direction.

2. The lighting module according to claim 1, wherein the elongated carrier comprises a length, the length being defined as the shortest distance between the first end-face and the second end-face, the length being at least 50 centimeters.

3. The lighting module according to claim 1, wherein the elongated carrier comprises at least one rim arranged on the first elongated main surface, wherein the at least one rim extends continuously between the first end-face and the second end-face.

4. The lighting module according to claim 3, wherein the at least one rim comprises a connection means for optics.

5. The lighting module according to claim 3, wherein the at least one rim serves as a lightguide, a reflector or a mixing wall.

6. The lighting module according to claim 1, wherein the elongated carrier is made of a material being one of: a metal, a ceramic, a polymer, or a combination thereof.

7. A method of electrically connecting a lighting module according to claim 1 with a connecting unit comprising a connecting area and a slot, the method comprising:
receiving and/or detachably fixating the connector of the lighting module in said slot;
electrically connecting the connector of the lighting module with the connecting area of the connecting unit.

8. The lighting device according to claim 1, wherein the second elongated main surface is a single surface with no discontinuities.

9. A lighting device comprising at least one lighting module and at least one connecting unit comprising a connecting area;
wherein the light module includes,
an elongated carrier and a flexible circuit;
wherein the flexible circuit comprises a first section accommodating a plurality of LED light sources, a second section and a connector;
wherein the connector is embedded in a circuitry of the flexible circuit and is accommodated in the second section for receiving power to power said plurality of LED light sources and for providing control commands to the plurality of LED light sources, wherein the connector extends at least partly in the first section;
wherein the elongated carrier comprises first end-face and a second end-face, and extending therebetween comprises a first elongated main surface and a second elongated main surface, the second elongated main surface being opposite to said first elongated main surface;
wherein the flexible circuit is folded around the second end-face, and wherein the second end-face comprises a recess, such that the fold is entirely comprised within the recess;
wherein the first section of the flexible circuit is connected to said first elongated main surface, and wherein the second section of the flexible circuit is connected to said second elongated main surface; and
wherein the elongated carrier comprises a cross-section comprising a curvature for improving the bending stiffness of the lighting module and for thereby reducing a deflection of the lighting module in its elongated direction; and,
wherein each of the at least one connecting unit is configured to electrically connect a respective connector of the at least one lighting module with the connecting area.

10. The lighting device according to claim 9, wherein the connecting unit comprises a slot for receiving and/or detachably fixating the at least one lighting module.

11. The lighting device according to claim 9,
further including at least two light modules;
a first respective lighting module including a first end-face, and
a second respective lighting module including a first end-face and a second end-face;
wherein the first end-face of a first respective lighting module abuts with the second end-face of a second respective lighting module.

12. A method of manufacturing a lighting module comprising a flexible circuit having a connector embedded in a circuitry of the flexible circuit and an elongated carrier, wherein the elongated carrier comprises first end-face and a second end-face, and extending therebetween comprises a first elongated main surface and a second elongated main surface, the second elongated main surface being opposite to said first elongated main surface,
wherein the second end-face comprises a recess;
wherein the method comprising:
connecting a first section of a flexible circuit to the first elongated main surface of the elongated carrier, wherein the first section accommodates a plurality of LED light sources;
folding the flexible circuit around the second end-face of the elongated carrier, such that the fold is entirely comprised within the recess;
connecting a second section of the flexible circuit to the second elongated main surface of the elongated carrier, wherein the second section accommodates the connector for receiving power to power said plurality of LED light sources and for providing control commands to the plurality of LED light sources, wherein the connector extends at least partly in the first section; and
wherein the elongated carrier comprises a cross-section comprising a curvature for improving the bending stiffness of the lighting module and for thereby reducing a deflection of the lighting module in its elongated direction.

13. The method according to claim 12, wherein the method comprising:
cutting said flexible circuit from a flexible circuit strip prior to the step of connecting.

* * * * *